United States Patent [19]

Barbier et al.

[11] Patent Number: 5,786,987
[45] Date of Patent: Jul. 28, 1998

[54] MODULAR ELECTRICAL INTERFACE DEVICE

[75] Inventors: René Barbier, Remilly sur Tille; Andras Gyongyosi, Dijon; André Vianes, Darois; Marc Soulas; Jean-Marie Colonna, both of Dijon, all of France

[73] Assignee: Schneider Electric SA, Boulogne-Billancourt, France

[21] Appl. No.: 592,550

[22] Filed: Jan. 26, 1996

[30]  Foreign Application Priority Data

Feb. 7, 1995 [FR] France ................... 95 01486

[51] Int. Cl.⁶ ............... H05K 7/12; H05K 7/14
[52] U.S. Cl. ............ 631/732; 361/728; 361/802; 361/807; 361/809; 439/532
[58] Field of Search .................. 361/728–733, 361/756, 788, 796, 801, 802, 807, 809, 810, 819, 826; 439/61, 532, 540.1, 717, 928

[56]           References Cited

U.S. PATENT DOCUMENTS 4,152,750   5/1979   Bremenour et al. ............ 361/796
4,540,232   9/1985   Zibung ........................... 439/717
4,672,511   6/1987   Meusel et al. ................... 361/802

FOREIGN PATENT DOCUMENTS

| 0 096 961 | 12/1983 | European Pat. Off. . |
| 0 518 762 | 12/1992 | European Pat. Off. . |
| 0 612 205 | 8/1994 | European Pat. Off. . |
| 40 31 772 | 4/1991 | Germany . |
| 93 11 526 | 10/1994 | Germany . |

*Primary Examiner*—Bot L. Ledynh
*Assistant Examiner*—John B. Vigushin
*Attorney, Agent, or Firm*—Oblon, Spivak, McClelland, Maier & Neustadt, P.C.

[57]              ABSTRACT

An interface device having a printed circuit board connected to a processor unit and an electronic base with grooves to receive the board with active or passive interface devices connected by terminal blocks. The interface devices are housed in separate modules having lengths which are equal to or integer multiples of a modulus wherein each module includes a strip of indicator openings or terminal operating openings disposed lengthwise at a particular pitch. The modules have complementary grooves and tongues on their side faces in order to permit assembly perpendicular to the plane of the board thereby forming a rigid assembly.

10 Claims, 2 Drawing Sheets

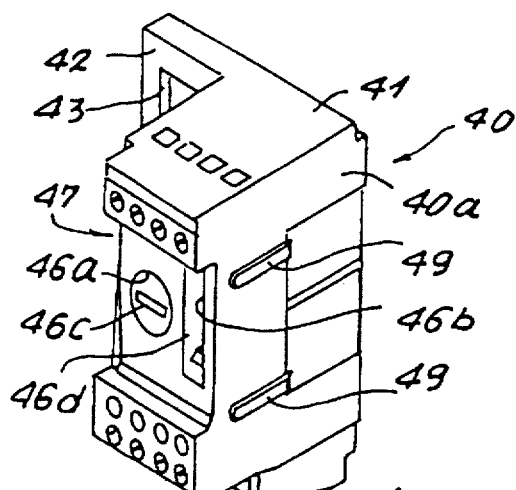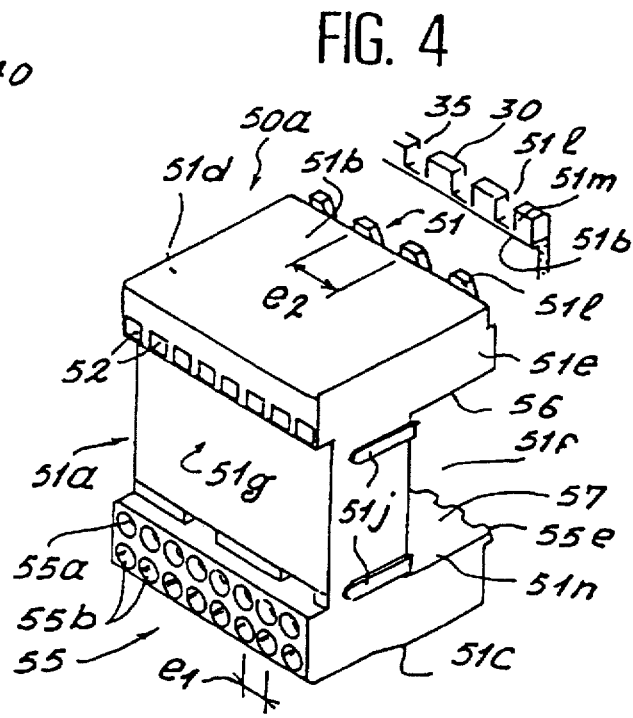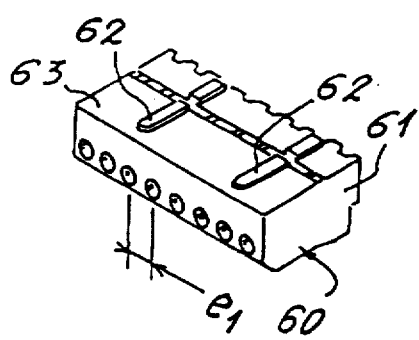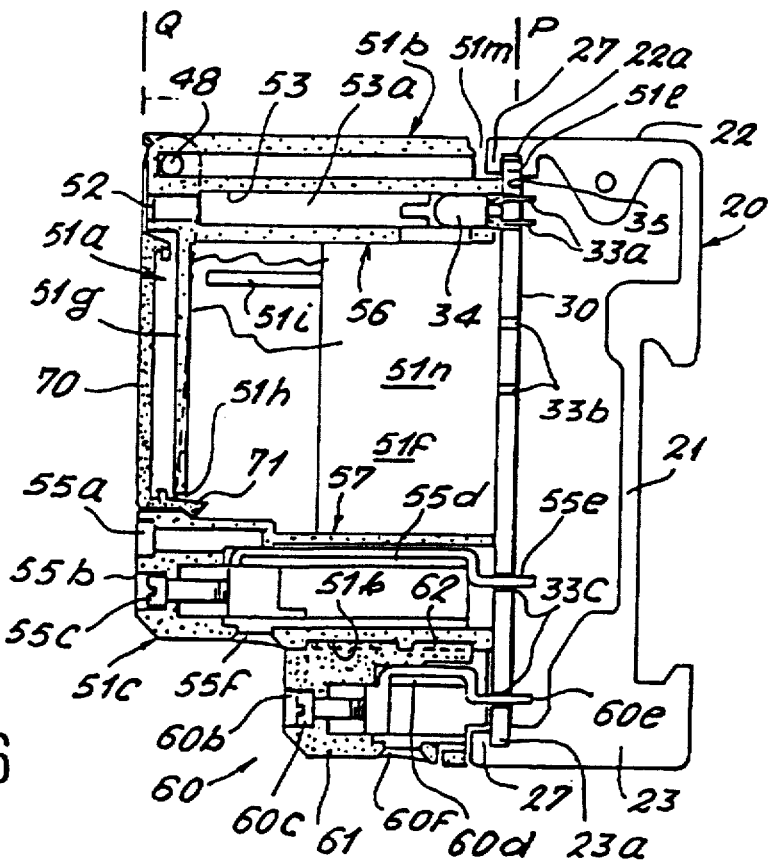

MODULAR ELECTRICAL INTERFACE DEVICE

BACKGROUND OF THE INVENTION

1. Field of the Invention

The present invention concerns an interface device of the type including a printed circuit board that can be connected to a processor unit, for example a programmable automatic controller processor unit, an elongate base having longitudinal grooves to receive the board, interface devices—components or circuits—soldered to the board and at least one terminal block also soldered to the board to enable connection thereto of an electrical equipment to be operated or controlled by the processor unit.

2. Description of the Prior Art

In prior art interface devices of this type the interface components or subsystems, for example relays or relay sockets, processor circuits, etc (active units), indicator LEDs, fuses or circuit-breakers (passive units), are soldered to the board in as many configurations as there are applications. These devices are therefore manufactured in many versions adapted to the requirements of the customer but this diversity presupposes the manufacture and the stock control of a large number of products, even if a single format is adopted for the base and the board. On the other hand, if an interface device of this kind is to be constructed from a single monobloc module, or a few monobloc modules, integrating the terminal blocks and indicator LEDs, the range is necessarily severely limited and the corollary of this is that it is impossible to provide a total response to the requirements of customers.

SUMMARY OF THE INVENTION

An object of the invention is, in a range of interface devices of the type described, to reconcile a great diversity of applications with great simplicity of manufacture and stock control, combined with an assembly that is guaranteed to be rigid.

In accordance with the invention:

the interface devices are housed in separate modules the lengths of which are equal to or integer multiples of a modulus, each module comprising a strip of indicator openings or terminal operating openings disposed lengthwise of the base at a particular pitch, the modules have on their side faces complementary grooves and tongues for assembling them together oriented perpendicularly to the plane of the board to form a rigid assembly.

This confers great flexibility of composition of functional modules combined with a consistent presentation and rigid assembly of the modules to each other and to the base/board assembly. This stiffness can be increased by interaction of the modules with an edge of the board. The modules advantageously have a length that is a multiple of four or eight times the pitch of the terminals.

The modules advantageously incorporate a strip of indicator openings and associated light conductors, a strip of access openings to a first row of terminals and, between these two strips, a recessed central part to receive a longitudinal cover, preferably a pivoting cover, common to all modules.

In some cases the assembly can be made more rigid by locating hooks at the rear of the modules adapted to engage in notches provided at regular intervals along a longitudinal edge of the board and retained against extraction forces directed towards the front by a longitudinal upstand on the base adjacent the groove in the base accommodating the edge of the board.

BRIEF DESCRIPTION OF THE DRAWINGS

The following description with reference to the drawings highlights the features and the advantages of the invention. In these drawings:

FIGS. 3 through 5 are perspective views of a power supply unit, an interface module and a modular additional terminal block.

FIG. 6 is an elevation view of the interface device in section on the line VI—VI.

DESCRIPTION OF THE PREFERRED EMBODIMENTS

Figure 1:
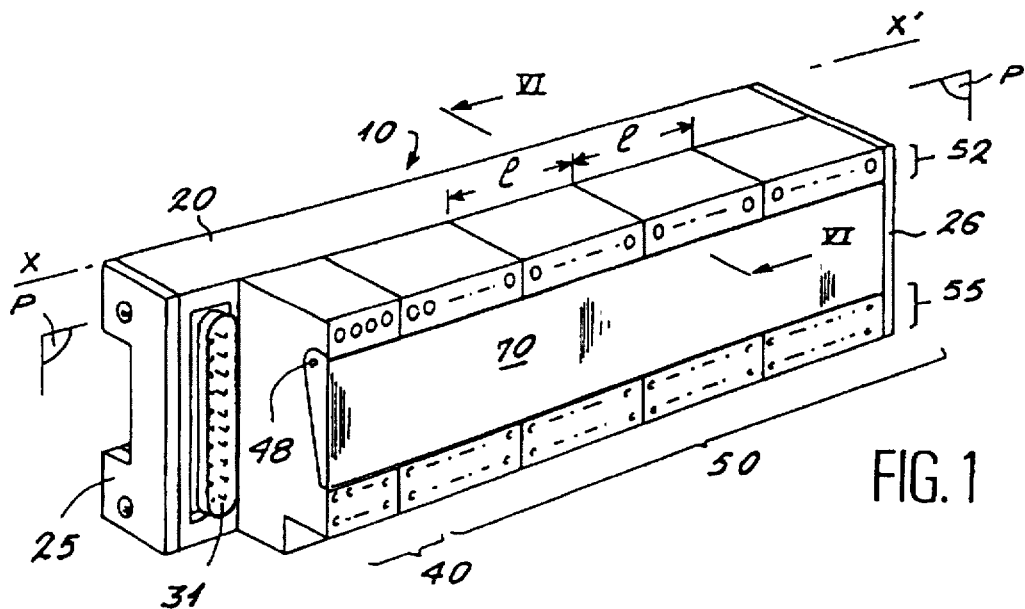
FIG. 1 is a perspective view of an interface device of the invention.
Figure 2:
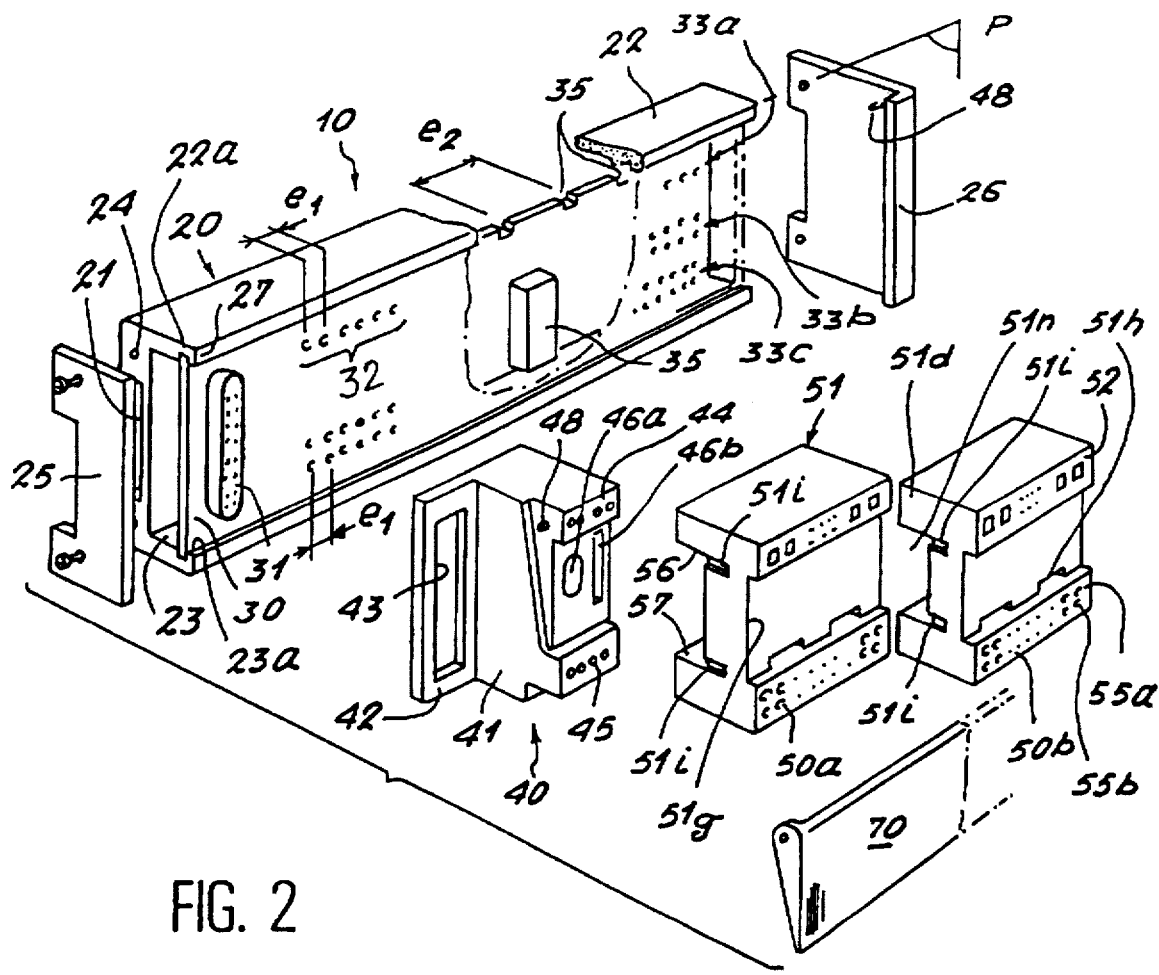
FIG. 2 is an exploded view of the interface device.

The interface device 10 shown in FIGS. 1, 2 and 6 comprises an elongate base 20 extending along a direction X–X', a printed circuit board 30 with a general plane P accommodated in the base, along its length, a power supply unit 40 and a plurality of modular interface units 50 soldered to the board 30, together with a common front cover 70.

The base 20 is a plastics material U-section member, preferably extruded and cut to the required length corresponding to the number of modular units required. It can equally well be moulded and/or made from metal. The base has a core 21 parallel to the plate P, a top flange 22 and a bottom flange 23. The flanges 22, 23 project towards the front from the core and comprise facing grooves 22a, 23a oriented in the direction X–X' into which the board 30 slides. Near the junction of the flanges with the core, the base comprises holes 24 for screwing on lateral closure plates 25, 26. The grooves 22a, 23a are flanked towards the front by profiled upstands 27. The rear part of the base can be fixed to a support, for example a standardised profiled support member, by means that do not need to be described.

At one end the printed circuit board 30 carries a multipin connector 31 for connecting a processor unit, for example a programmable automatic controller, and holes 32, 33 to receive leads or pins of indicator, relay, processor, terminal members of which some are allocated to the power supply unit 40 (holes 32) and the others in groups to the interface units 50 (holes 33).

The holes 33 associated with the interface units 50 are disposed in a number of rows and, in each row, are regularly spaced with a particular pitch I1. These rows comprise top rows 33a which receive the connecting leads of light-emitting diodes 34, middle rows 33b which receive the connecting leads of passive or active devices, for example fuses or circuit-breakers, permanently wired (i.e. not plug-in) relays 35 or processor circuits, and bottom rows 33c which receive the connecting leads of conductive parts of modular terminal blocks integral with or attached to the interface units.

The power supply unit 40 comprises a module 41 with a flange 42 in which is an opening 43 for the connector 31, top and bottom terminals 44 and 45 for connection to a source of electrical power and front openings 46a, 46b for a fuse 46c and a circuit-breaker 46d (see FIG. 3). The central area 47 of the front of the module 41 is set back relative to the areas containing the terminals 44 and 45, to accommodate the pivoting cover 70. A pivot 48 on which the cover pivots is provided on the side of the module 41. On the side towards the adjacent interface unit 50a the power supply unit 40 has a side wall 40a incorporating two dovetail-section ribs 49 oriented in a direction Y-Y' orthogonal to the plane P of the board and cooperating with complementary grooves in the adjacent interface unit 50a to fasten them rigidly together.

In this embodiment the modular interface units 50a, 50b, etc are closed at the front. Each comprises a module 51 with a front face 51a, a top face 51b, a bottom face 51c and side faces 51d, 51e delimiting a central interior space 51f for groups of permanently wired (i.e. not plug-in) components, relays, processor circuits, etc.

The units 50 are modular in the sense that they have a length 1 equal to or an integer multiple of a particular modulus, for example 4 to 8 times the pitch of the terminals, this length being matched to the number of channels of the automation equipment to be controlled.

The front face 51a has in its upper part a strip of aligned openings 52 with a regular pitch $e_1$ and passages 53 which house light conducting rods 53a oriented in the direction Y-Y' with respective ends facing the openings 52 and facing the same number of light-emitting diodes 34, making the latter easier to see.

In its lower part the front face 51a has a strip of openings arranged in the direction Y-Y', namely a row of test openings 55a and a row of access openings 55b for a first series of terminals 55 with pitch $e_1$. Each terminal 55 comprises a screw 55c that can be turned by a screwdriver inserted into the opening 55b and an electrically conductive member 55d accessible for testing via the opening 55a; the conductive member 55d is extended towards the rear by a connecting lead 55e soldered into a hole 33c in the board 30. Note that the housings for the light conducting rods 55a and the electrically conductive members 55d are isolated from the interior space 51f of the module by horizontal walls 56, 57.

To the rear of holes 55f for inserting conductors to be connected to the first row of terminals 55, there is provided under the bottom face 51c of the module 51 a second row of terminals 60 in the form of a modular terminal block 61 the same length as the associated module 51. The terminal block 61 is separate from the module 51 and is removably attached to it, set back from the row of terminals 55, by means of ribs 62 provided on its top face 63 and cooperating with grooves 51k in the bottom face 51c of the module; the ribs and grooves are dovetail-shape and are oriented orthogonally to the plane P of the board. Each terminal 60 comprises an opening 60b providing access to a screw 60c, a conductive member 60d optionally extended to the rear by a connecting lead 60e soldered into a hole 33c in the board and an opening 60f for inserting a conductor. The terminal block 61 can be used to distribute a single potential; if it is not required, a dummy terminal block of the same size can be fitted.

In the middle part of the front face 51a, i.e. between its top part with the strip of indicator openings 52 and its bottom part with the strip of openings 55a, 55b providing access to the first row of terminals 55, there is a central recess 51g; the depth of this recess is sufficient to accommodate the pivoting cover 70 in such a manner that its front plane Q is level with the top and bottom parts of the front face 51a. The bottom part of the central recess 51g includes recesses 51h to receive clipping fingers or other parts 71 of the cover. The module 51 is generally U-shaped and its branches respectively house diodes and their light conductors and the conductive members of the terminals, whereas its core serves as a front panel section, forms a receptacle for the common cover and protects an interior space for the interface devices. Note that the side walls 51d, 51e of the modules 51 leave openings 51n suited to the overall dimensions of components, for example relays 35, so that the outside walls of these relays are flush with the outside face of the walls 51d, 51e.

Each interface module 51 has two dovetail-section grooves 51i on one side face 51d and two complementary dovetail-shape ribs 51j on the opposite side face 51e, so that the various modules can be assembled together in a rigid manner by nesting in the direction Y-Y' before their leads are soldered into the holes 33b, 33c in the printed circuit, to constitute the required device.

The cover 70 is articulated by pivots 48 to the ends of the interface device, either as shown here, on one side face of the power supply module 41 and on one side plate 26, or on side faces of two end modules 51a. The cover can be opaque or transparent and carry an identifying label specific to the user, while the recessed part 51g of the front face of the modules 51a carries a diagram of the electrical circuit.

In some versions of the interface device, especially passive versions including only indicator devices at the top and terminal blocks at the bottom, it is desirable to increase the stiffness with which the modules are assembled to the base. To this end, the modules 51a have at the rear fingers or hooks 51l at a regular interval $e_2$ that is a multiple of $e_1$; likewise, notches 35 at the pitch $e_2$ are provided in the top edge of the board 30. The hooks 51e are designed to locate in the notches 35 and to leave between themselves and the rear face of the module 51a a space 51m into which the profiled upstand 27 of the flange 22 of the base fits. In this way the top part of the interface unit 50 is firmly retained in the base 20 after the board 30 to which the units are soldered is slid into the grooves 22a, 23a in the base.

We claim:
1. Interface device comprising:
   a printed circuit board adapted to be connected to a processor unit such as a programmable automatic controller,
   an elongate base having lengthwise grooves to receive the board,
   active or passive interface devices connected by terminal blocks to an electrical equipment to be operated or controlled by the processor unit, the interface devices and the terminal blocks being soldered to the board, characterised in that:
   the interface devices are housed in separate modules the lengths (1) of which are equal to or integer multiples of a modulus, each module comprising a strip of indicator openings or terminal operating openings disposed lengthwise of the base at a particular pitch ($e_1$),
   the modules have on their side faces complementary grooves and tongues for assembling them together oriented perpendicularly to the plane (P) of the board to form a rigid assembly.

2. Device according to claim 1 characterised in that the modules have a length which is a multiple of 4 or 8 times the pitch of the terminals.

3. Device according to claim 1 characterised in that the module comprises passages accommodating light conducting rods and having respective ends facing the indicator openings and a row of light-emitting diodes on the board.

4. Device according to claim 1 characterised in that the module integrates a first row of terminals accessible via the strip of operating openings and comprising conductive members soldered to the board.

5. Device according to claim 4 characterised in that each module is associated with a second row of terminals in the form of a terminal block removably fixed to the module by grooves and tongues orthogonal through the plane (P) of the board and set back relative to the first row of terminals.

6. Device according to claim 4 characterised in that the module has, between the row of indicator openings and the first row of terminals, a central part that is slightly set back to receive a longitudinal cover common to all the modules.

7. Device according to claim 6 characterised in that the common cover is pivotably mounted on pivots carried by the lateral ends of the assembly and has lugs that clip into openings provided at regular intervals on the modules.

8. Device according to claim 1 characterised in that the module includes locating hooks engaged in notches at regular intervals along one longitudinal edge of the board and retained by a longitudinal upstand of the base adjacent the groove in the base accommodating the edge concerned.

9. Device according to claim 1 characterised in that the module is generally U-shaped with openings at the sides matched to the external dimensions of active components housed inside the module.

10. Device according to claim 1 characterised in that a power supply unit fixed to the board near one end of the base has grooves or tongues on one side face that nest in complementary members of an adjacent module, these grooves or tongues being oriented perpendicularly to the plane (P) of the board.

* * * * *